United States Patent [19]
Kanai

[11] Patent Number: 5,841,565
[45] Date of Patent: Nov. 24, 1998

[54] SEMICONDUCTOR DEVICE, LIGHT-RECEIVING MODULE AND METHOD FOR MANUFACTURING SAME

[75] Inventor: Tatsuo Kanai, Tokyo, Japan

[73] Assignee: NEC Corporation, Tokyo, Japan

[21] Appl. No.: 44,901

[22] Filed: Mar. 20, 1998

[51] Int. Cl.⁶ .................................................. H04B 10/00
[52] U.S. Cl. ....................... 359/189; 359/163; 257/433; 385/91; 385/93
[58] Field of Search .................................... 359/189, 163, 359/193, 195; 257/432, 433, 458, 466; 385/91, 92, 94, 93

[56] References Cited

U.S. PATENT DOCUMENTS

| | | | |
|---|---|---|---|
| 5,537,503 | 7/1996 | Tojo et al. | 385/93 |
| 5,574,289 | 11/1996 | Aoki et al. | 257/17 |
| 5,712,504 | 1/1998 | Yano et al. | 257/452 |
| 5,786,589 | 7/1998 | Segawa et al. | 257/81 |

FOREIGN PATENT DOCUMENTS 6-275855  9/1994  Japan .

*Primary Examiner*—Rafael Bacares
*Attorney, Agent, or Firm*—Young & Thompson

[57] ABSTRACT

It is an object of the invention to provide a light-receiving module, in which characteristic of a semiconductor amplifier unit mounted thereon is inspected on the course of fabrication and an outside photosensor do not come to nothing, and a method for fabricating the same. In the package of the light-receiving module, a semiconductor chip, which comprises an amplifier and a inside photosensor for inspecting it, and an outside photosensor for receiving a light signal are allocated. First, the inside photosensor is irradiated with a light for inspecting amplifier, and the output of the amplifier is investigated. In case that the amplifier is recognized as normal, an Al pattern communicated with the input port of the amplifier is cut, and the output port of the outside photosensor is connected with the input port of the amplifier by a bonding wire. Thus, the light-receiving is completed. In case that the amplifier is recognized as inferior, fabrication process is discontinued, and then, circuit elements necessary for fabrication dose not come to nothing.

6 Claims, 7 Drawing Sheets

SEMICONDUCTOR DEVICE, LIGHT-RECEIVING MODULE AND METHOD FOR MANUFACTURING SAME

FIELD OF THE INVENTION

The invention relates to a semiconductor chip with a semiconductor amplifier unit mounted thereon, a light-receiving module connected with a photosensor allocated outside the semiconductor chip and a method for fabricating the same, and especially to the semiconductor chip, the light-receiving module and the method for fabricating the same, all of which are suited for an optical communication.

BACKGROUND OF THE INVENTION

An optical receiver in an optical communication apparatus is designed to improve its receiving characteristic by employing a light-receiving module, which is provided with a photosensor for receiving an light signal and a large scale integrated (LSI) circuit for amplifying the output of the photosensor, in most cases. In fabrication process of the light-receiving module, an article to be rejected is excluded by inspecting an AC characteristic of the semiconductor amplifier unit.

The most important structural elements in the conventional light-receiving module are a photosensor for converting a light signal incident thereon into an electrical information signal and a semiconductor chip comprising a semiconductor amplifier unit for amplifying the output of the photosensor. The photosensor and the semiconductor chip are respectively formed on different substrates and sealed in the same package. They are connected with each other by connecting wires, and an optoelectronic circuit in the light-receiving module thus obtained is inspected on the cource of fabrication. In case that the semiconductor amplifier unit is recognized as inferior in the inspection, the photosensor and the connecting wires come to nothing.

SUMMARY OF THE INVENTION

Accordingly, it is an object of the invention to provide a semiconductor chip, in which characteristic of a semiconductor amplifier unit thereon can be inspected in the cource of fabrication of a light-receiving module.

It is a further object of the invention to provide a light receving module, in which characteristic of a semiconductor amplifier unit fitted therefor can be inspected in the cource of fabrication, and an outside photosensor to be connected with a semiconductor chip and connecting wires to be used therefor dot not come to nothing, even in case that the semiconductor amplifier unit is recognized as inferior in the inspection.

It is a still further object of the invention to provide a method for fabricating a light-receiving module, in which characteristic of a semiconductor amplifier unit fitted therefor can be inspected in the cource of fabrication, and an outside photosensor to be connected with a semiconductor chip and connecting wires to be used therefor dot not come to nothing, even in case that the semiconductor amplifier unit is recognized as inferior in the inspection.

According to the first feature of the invention, a semiconductor chip comprises:
a semiconductor amplifier unit mounted on a substrate for amplifying an electrical signal supplied from an outside of the substrate,
a photosensor mounted on the substrate for converting a light incident thereon into an electrical inspection signal for inspecting the semiconductor amplifier unit, and
electrical inspection signal transmission means inserted between an output port of the photosensor and an input port of the semiconductor amplifier unit, which is interrupted on condition that the semiconductor amplifier unit has been recognized as suitable for specifications in the inspection.

According to the second feature of the invention, a light-receiving module comprises:
a semiconductor chip comprising:
a semiconductor amplifier unit mounted on a substrate for amplifying an electrical signal supplied from an outside of the substrate,
a first photosensor mounted on the substrate for converting a first light incident thereon into an electrical inspection signal for inspecting the semiconductor amplifier unit, and
electrical inspection signal transmission means inserted between an output port of the first photosensor and an input port of the semiconductor amplifier unit, which is interrupted on condition that the semiconductor amplifier unit has been recognized as suitable for specifications in the inspection;
a second photosensor allocated outside the substrate for converting a second light incident thereon into an electrical information signal, and
electrical information signal transmission means inserted between an output port of the second photosensor and the input port of the semiconductor amplifier unit, which is established on condition that the electrical inspection signal transmission means has been interrupted.

According to the third feature of the invention, a method for fabricating a light-receiving module comprises the steps of:
forming a semiconductor chip comprising:
a semiconductor amplifier unit mounted on a substrate for amplifying an electrical signal supplied from an outside of the substrate,
a first photosensor mounted on the substrate for receiving a first light for inspecting the semiconductor amplifier unit, and
an electrical inspection signal transmission pattern inserted between an output port of the first photosensor and an input port of the semiconductor amplifier unit,
discliminating whether the semiconductor amplifier unit is suitable for specifications or not by irradiating the first photosensor with the first light,
cutting the electrical inspection signal transmission pattern on condition that the semiconductor amplifier unit is recognized as suitable for the specifications, and
connecting the input port of the semiconductor amplifier unit with an output port of a second photosensor allocated outside the substrate for receiving a second light serving as a light signal.

BRIEF DESCRIPTION OF THE DRAWINGS

The invention will be explained in more detail in conjunction with appended drawings, wherein.

DESCRIPTION OF THE PREFERRED EMBODIMENTS

Before explaining a light-receiving module in the preferred embodiments according to the invention, the aforementioned conventional light-receiving module will be explained.

Figure 1:
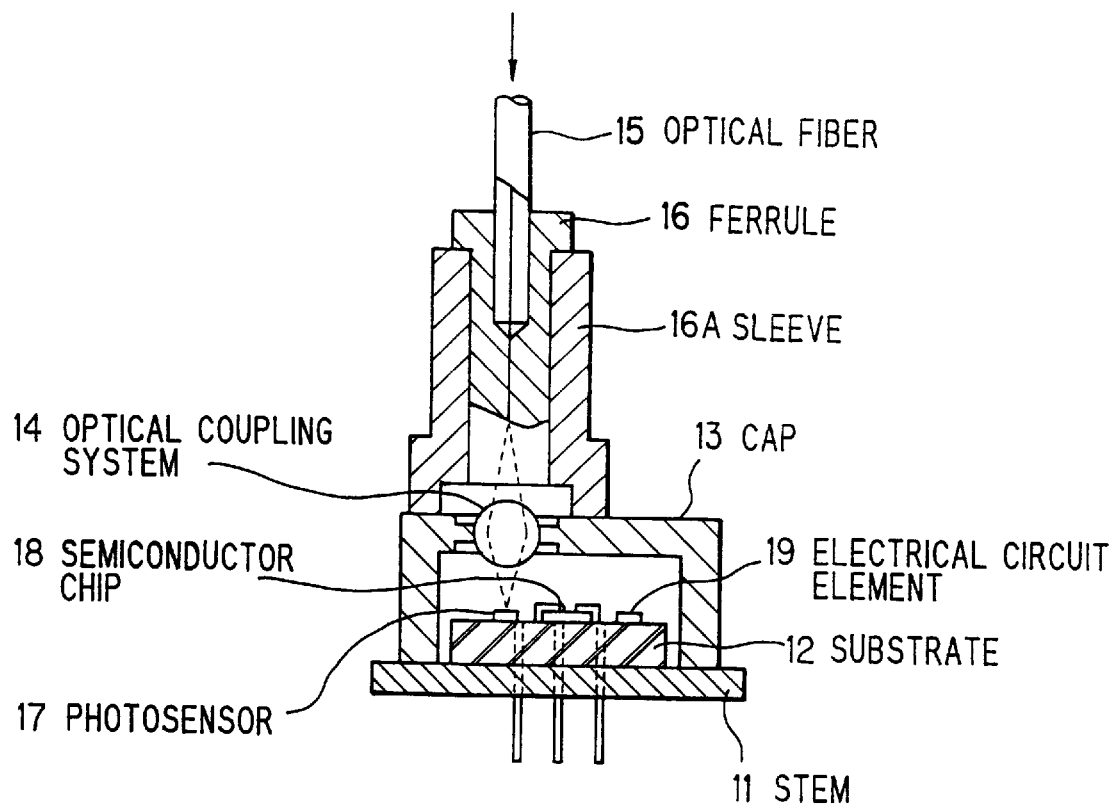
FIG. 1 is a cross-sectional view for showing an example of conventionally proposed light-receiving module.

FIG. 1 shows a light-receiving module disclosed in Japanese Patent Kokai 6-275855. In this light-receiving module, a nearly circular substrate 12 composed of multilayered ceramic discs with conducting patterns is concentrically adherent to the top surface of a circular disc shaped stem 11 made of metal with small thermal expansion coefficient. An optical coupling system 14 comprising a lens is fitted up at a position deviated from the central axis of a cap 13, which seals the substrate 12. The sleeve 16 a of a ferrule 16, to which the output end of an optical fiber 15 is fixed, is stuck fast to the top of the cap 13. In the cap 13, a photosensor 17, a semiconductor chip 18 and the electrical circuit element of the chip are mounted on the substrate 12. A photosensor 17 is implemented near the periphery of the substrate 12 so that it can receive a light supplied from the optical coupling system 14. The electrical circuit element 19 of the chip is allocated near the periphery of the substrate 12.

Figure 2:
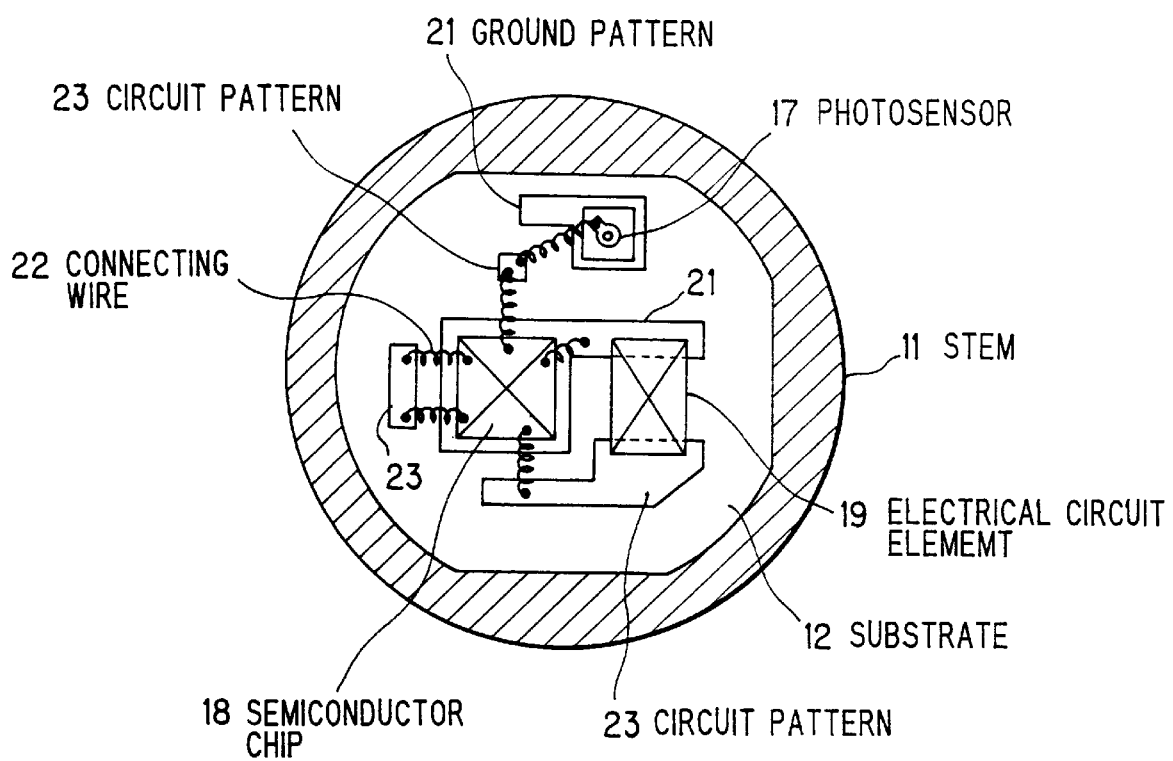
FIG. 2 is a planar view for showing arrangement of circuit elements accommodated in a stem of the conventional light-receiving module shown in FIG. 1.

FIG. 2 shows arrangement of the structural elements on the substrate 12 in the light-receiving module. On the substrate 12 fixed to the stem 11, the aforementioned photosensor 17, the semiconductor chip 18 and the electrical circuit element 19 of the chip are arranged. They are connected with ground patterns 21. Moreover, they are connected with circuit patterns 23 directly or via connecting wires 22.

In the light-receiving module shown in FIGS. 1 to 2, the photosensor 17 and the semiconductor chip 18 are separated from each other. The reason why such a configuration is adopted is as follows. If the light-receiving module is so fabricated that the semiconductor amplifier unit and the phorosensor are formed on the same Si-substrate, its efficiency in optical to electrical conversion for light of the 1.3 $\mu$m or 1.5 $\mu$m band becomes extremely low. That is to say, the wavelength of light absorbed by the photosensor formed on the Si-substrate does not coincide with that of the light signal in the optical communication.

Figure 3:
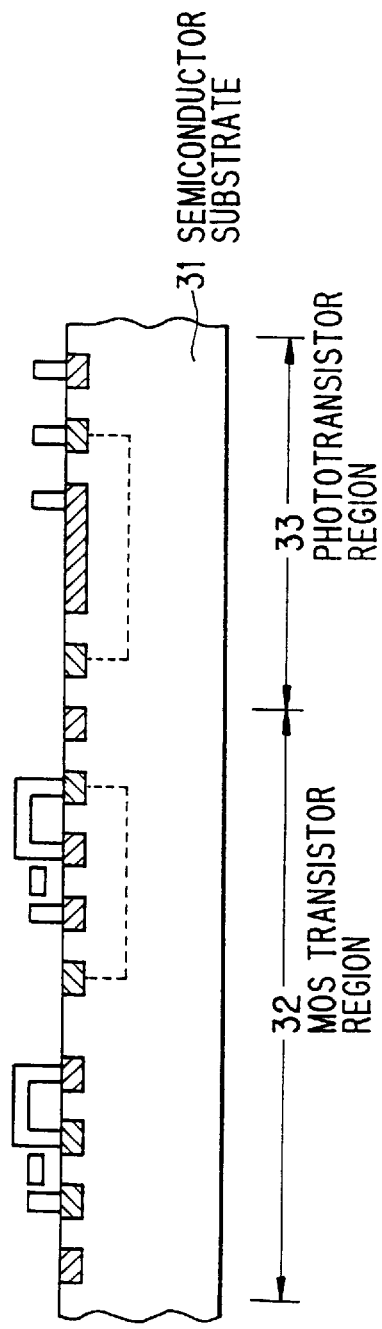
FIG. 3 is a cross-sectional view for showing a conventional semiconductor chip, in which a photosensor and a semiconductor amplifier unit are formed on the same substrate.

FIG. 3 shows a technology disclosed in Japanese Patent Kokai 59-144187, in which a photosensor and a metal oxide semiconductor (MOS) transistor are integrated on the same substrate. In this semiconductor device, regions of two kinds, a MOS transistor region 32 and a phototransistor region 33, are formed by the same process. Moreover, a photosensor is integrated with a semiconductor amplifier unit for amplifing its output.

In the light-receiving module shown in FIG. 3, a disadvantage of the conventional light-receiving module shown in FIGS. 1 to 2 can be eliminated by forming a MOS transistor region 32 and a phototransistor region 33 on the same N-type semiconductor substrate 31. However, since a semiconductor amplifier unit is formed on a GaAs substrate, being other than a Si-substrate, the cost of the light-receiving module becomes higher than that of the conventional light-receiving module, in which the photosensor and the semiconductor amplifier unit are separately formed. The reason is the a semiconductor device-fabricating process based on a Si-substrate can provide a semiconductor device at the lowest price.

Accordingly, in case that a cost of a product is regarded as the most important, the light-receiving module is fabricated according to the method shown in FIGS. 1 to 2. However, in the conventional method, the light-receiving module is inspected after semiconductor devices are implemented to the package. In the inspection, the output of the photosensor 17 is amplified by the semiconductor chip 18, and characteristic of the amplifier is estimated. In case that the semiconductor amplifier unit in the semiconductor chip 18 is recognized as inferior, the normal photosensor 17 and wires 22 for connecting the photosensor 17 with the semiconductor chip 18 come to Hereafter, the invention be explained in more detail in the preferred embodiments.

Figure 4:
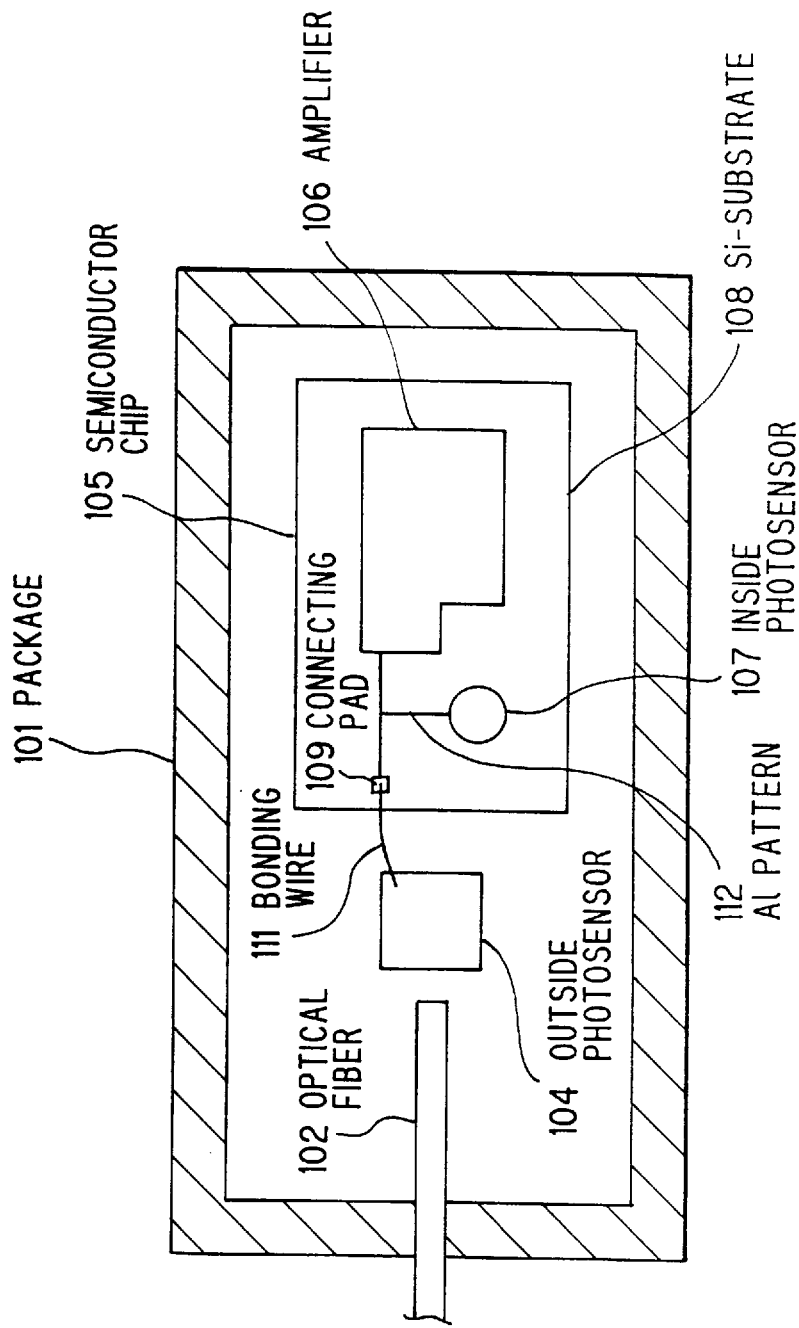
FIG. 4 is a cross-sectional view for showing a light-receiving module as a preferred embodiment of the invention.

FIG. 4 shows an outline of a structure of an light signal receiving module according to a preferred embodiments of the invention. In the optical signal receiving module, an end portion of an optical fiber 102 for transmitting an light signal is inserted into a through hole formed at a predetermined point on a side wall of the package 101. On the bottom surface of the package 101, a photosensor for receiving an light signal (an outside photosensor, hereinafter) 104 is set close to the output end of the optical fiber 102 so that the outside photosensor 104 can receive a light emitted form the optical fiber 102. A semiconductor chip 105 is positioned on the bottom surface of the package 101 leaving a predetermined space between the outside photosensor 104. An amplifier 106, which amplifies the output signal of the outside photosensor 104, and a photosensor 107 (an inside photosensor, hereinafter), which generates an electrical signal for inspecting the amplifier 106, are mounted on the same Si-substrate 108, and compose the semiconductor chip 105.

The output port of the outside photosensor 104 is connected with a connecting pad 109 on the Si-substrate 108 by a bonding wire 111. Electrical conduction is provided between the connecting pad 109 to be communicated with the outside photosensor 104 and the input port (not shown) of the amplifier 106. When the light signal is received by the outside photosensor 104, an electrical signal converted thereby is amplified by the amplifier 106. One end of an Al pattern 112 is permanently connected with the output port of the inside photosensor 107, and the other end of it is initially connected with the input port of the amplifier 106. However, electrical conduction between the inside sensor 107 and the amplifier 106 is interrupted, when both the ends of the bonding wire 111 has been bonded. This will be again explained in later.

Figure 5:
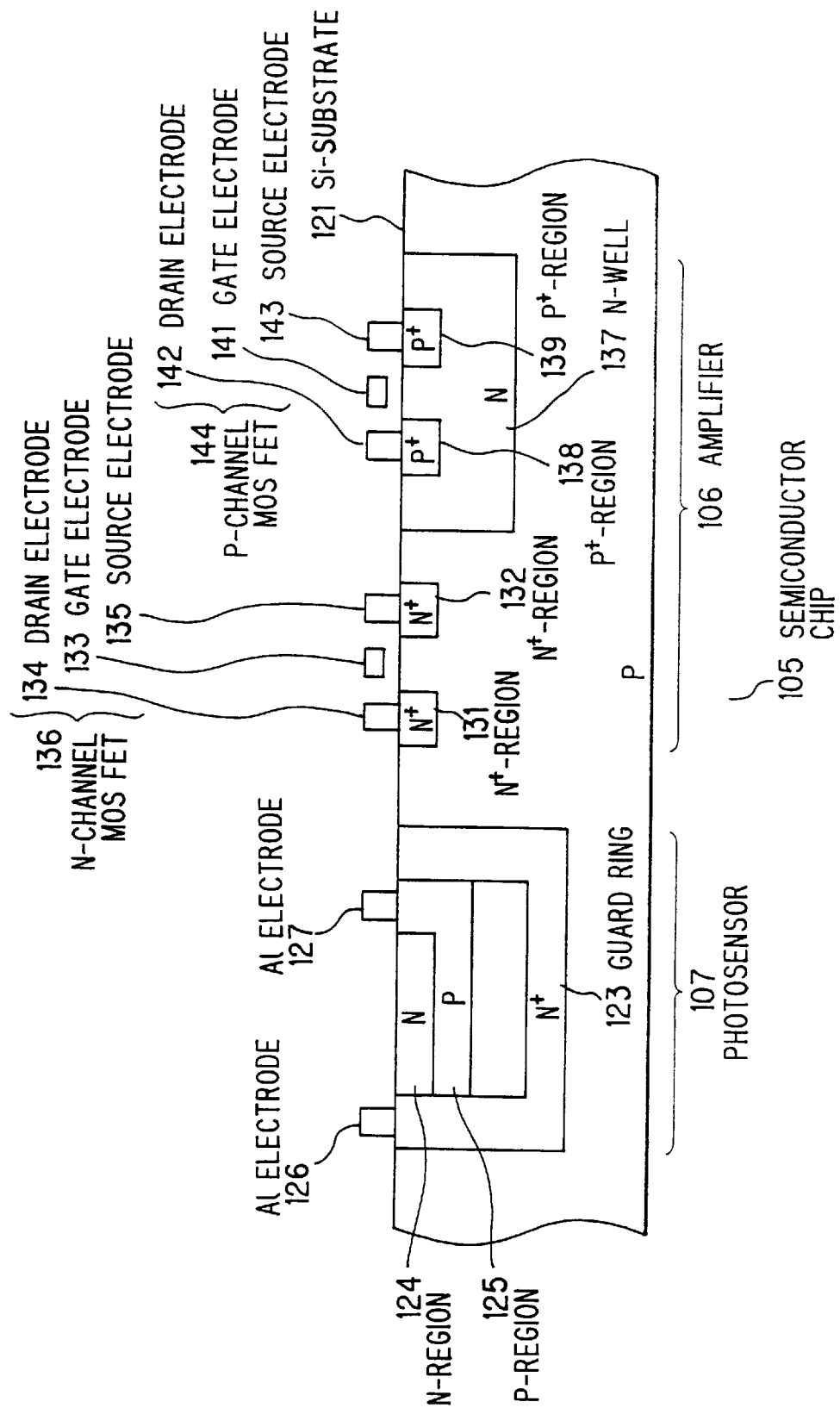
FIG. 5 is a cross-sectional view for showing a semiconductor chip to be fitted for the light-receiving module shown in FIG. 4.

FIG. 5 shows a cross-sectional view of the semiconductor chip 105 according to the invention. The semiconductor chip 105 is composed of the inside photosensor 107 having a PNP junction and the amplifier 106 comprising MOS transistors serving as active elements, each of which is fabricated on a P-type Si-substrate.

First, the steps of fabricating the inside photosensor 107 will be explained. After forming a guard ring 123 on the P-type Si-substrate 121, a N-type semiconductor region 124 and a P-type semiconductor region 125 are formed, and a PN junction can be obtained. Then, an Al electrode 126 is formed on the guard ring 123, and the other Al electrode 127 is formed on a P-type region 125. Since the inside phososensor 107 is formed on the P-type Si-substrate, the wavelength of a light absorbed by the inside photosensor 107 is in a range of 0.8 to 0.9 μm. According to the aforementioned characteristic, the efficiency of optical to electrical (O/E, hereinafter) conversion of the inside photosensor 107 for the light in the 1.3 μm or 1.5 μm band, which is supplied from the optical fiber 102 shown in FIG. 4, is exceedingly low. Accordingly, the inside photosensor 107 with the PNP junction is not used for receiving the light signal supplied form the optical fiber 102, but only for receiving the light for inspecting the characteristic of the amplifier 106.

Then, the steps of fabricating the amplifier 106 will be explained. After forming two N+ regions, 131 and 132, on the P-type Si substrate 121, a N channel metal oxide semiconductor field effect transistor (MOSDET, hereinafter) 136 can be fabricated by forming a gate electrode 133, a drain electrode 134 and a source electrode 135. By the steps of farming a N-well region 137 by impurity doping, respectively forming P+ regions, 138 and 139, thereon, and forming a gate electrode 141, a drain electrode 142 and a source electrode 143 as shown in FIG. 5, a P channel MOSFET 144 can be fabricated. The amplifier 106 for receiving the light signal can be composed of the MOSFETs, 136 and 144, of two kinds, resistors and capacitors, both being well known.

As mentioned in the above, the amplifier 106 and the inside photosensor 107, both being formed on the P-type Si-substrate 121, are connected with each other by the Al pattern 112 on the top surface of the semiconductor chip 105. The reason for adopting the Al pattern 112 is that electrical conduction between the amplifier 106 and the inside photsensor 107 can be interrupted thermally and easily, after the inspection of the amplifier 106 is over.

Figure 6:
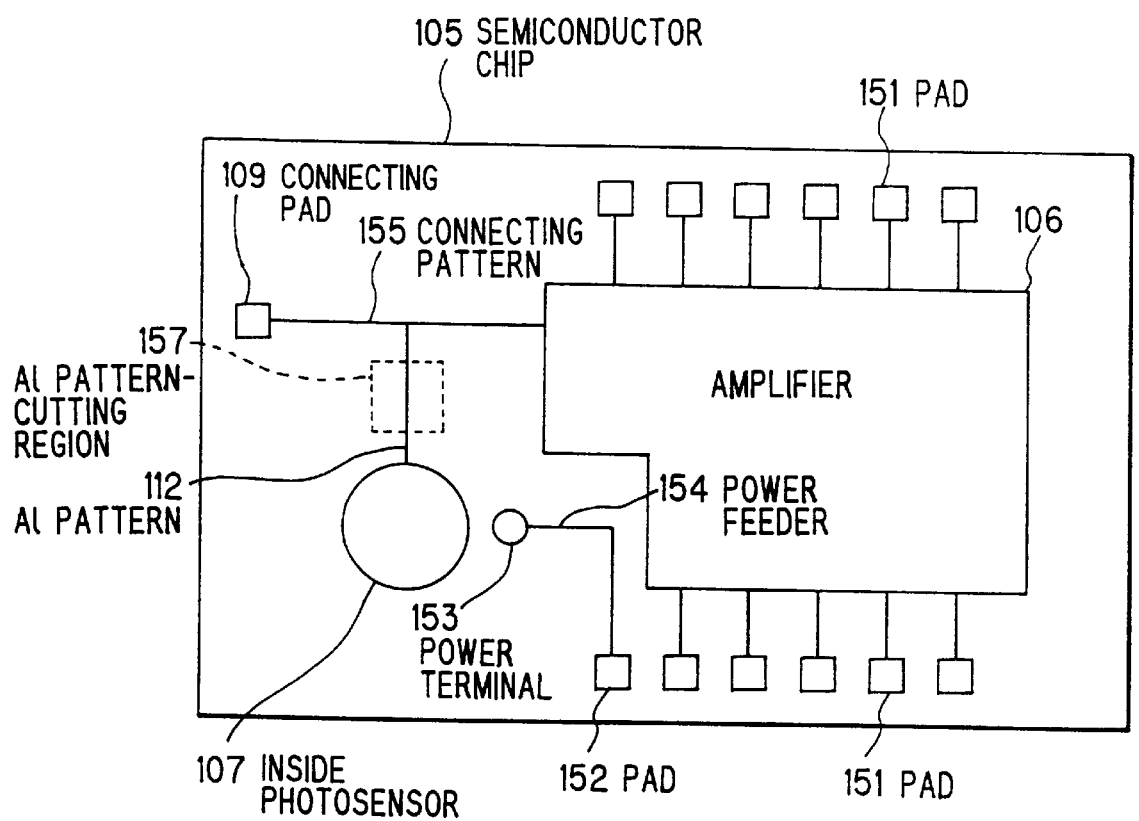
FIG. 6 is a planar view for showing arragement of circuit elements on the semiconductor chip according to the preferred embodiment of the invention, which shows the sate of the semiconductor chip before an inspection.

FIG. 6 shows the arrangement of structural elements on the P-type Si-substrate shown in FIG. 5. The amplifier 106 and the inside photosensor 107, both have being explained in FIG. 4, are arranged on the semiconductor chip 105. Circuit elements of the amplifier 106 are connected with the pad 109, which is to be communicated with the outside photosensor 104, and input and output pads 151 of the other amplifiers (not shown). Moreover, a power pad 152 for the inside photosensor 107 is connected with power terminal 153 of the inside photosensor 107 by a power feeder 154. A connecting pattern 155, which connects the connecting pad 109 with the amplifier 106, and the output port of the inside photosensor 107 are connected with each other by the Al pattern 112, which has been mentioned in Fig.4. A square area surrounded by a broken line, which is positioned at the almost middle point of the Al pattern 112, is an Al pattern-cutting region 157, where the Al pattern is cut by a laser beam. The Al pattern-cutting region 157 is allocated on the top surface of the semiconductor chip 105 leaving spaces between the other structural elements in order to prevent undesirable influence on them caused by heat generated in the case of laser-cutting.

Figure 7:
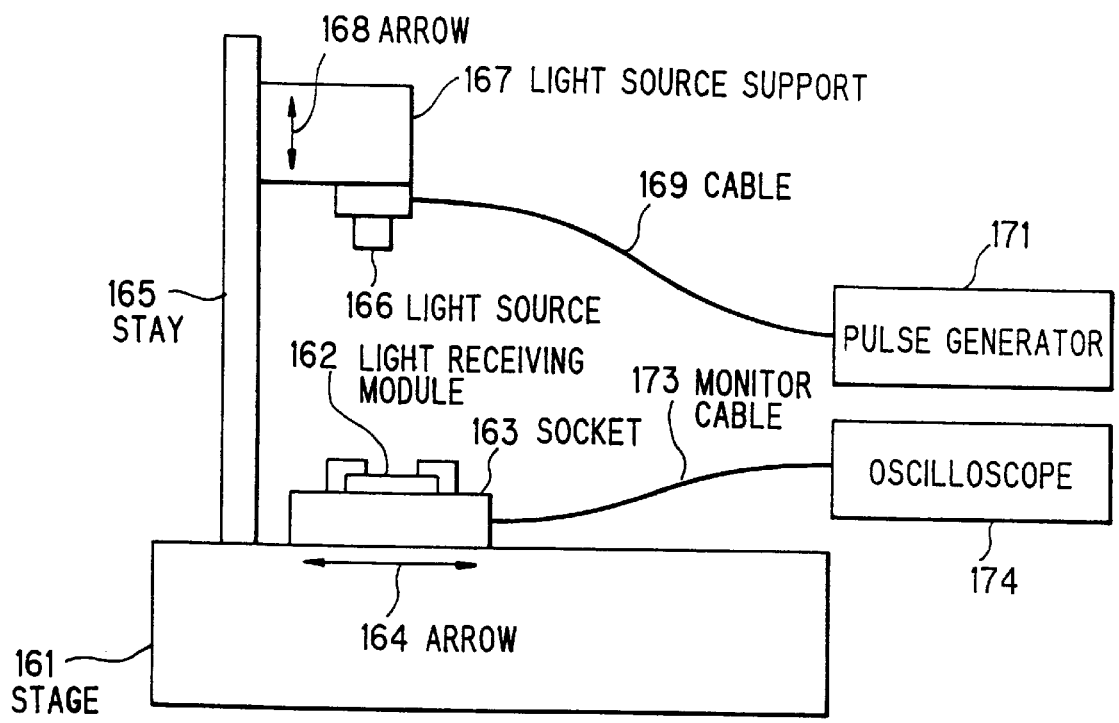
FIG. 7 is a drawing for explaining the inspection of the semiconductor amplifier unit in the process of fabrication of the light-receiving module according to a preferred embodiment of the invention.

FIG. 7 is a schematic diagram for explaining the important part of the process of fabrication of the light-receiving module according to the invention. A socket 163, which supports the light-receiving module 162 under fabrication, is allocated on a stage 161 so that it is movable in a direction shown by an arrow 164. A light source support 167, to the bottom of which a light source 166 for inspecting the amplifier 106 is fixed, is allocated near a top of a stay 165 on the stage 161 so that it is movable in a direction shown by an arrow 168. The light source 166 is connected with a pulse generator 171 via a cable 169 for pulse transmission. The socket 163 connected with an oscilloscope 174 via a monitor cable 173.

The light source 166 irradiates the inside photosensor 107, which is formed on the semiconductor chip 105 as shown in FIG. 6, with a laser beam for inspecting the amplifier 106. An AlGaAs laser diode with a lasing wavelength of 0.85 μm is used as the light source 166 for inspecting the amplifier 106 in conformity with the characteristic of the inside photosensor 107 formed on the Si-substrate 121. In the light-receiving module 162, at the initial stage of inspection of the amplifier, the inside photosensor 107 and the connecting pattern 155 are connected with each other by the Al pattern 112, and both the ends of the bonding wire 111 are not yet bonded with the connecting pad 109 shown in Figs.4 and 6 and the outside potosensor 104 as shown in FIG. 4. The amplifier 106 in the light-receiving module 126 is supplied with elerical power via the socket 163 as shown in FIGS. 6 and 7.

In the apparatus mentioned in the above, a worker adjusts the relative position of the light-receiving module 162 with respect to the light source 166 on the stage 161, activates the light source 166 and the pulse generator 171, and irradiates the photosensor 107 with a laser beam modulated by pulse emitted from the light source 166. The output of the amplifier 106 is supplied from the socket 163 to the oscilloscope 174 via the monitor cable 173. The worker discriminates whether the amplifier 106 satisfies the specifications or not by the aid of a pattern on the oscilloscope 174. In case that a system for inspecting the amplifier is automated, the system can automatically discriminate whether the amplifier 106 satisfies specifications or not through investigation into the behavior of the output of the amplifier in the time domain.

If the worker or the system forms a judgement that the amplifier 106 satisfies the specifications, the lightreceiving module 162 on the stage 161 can be put into practical use. Then, the part of the Al pattern 112 lying on the Al pattern-cutting region 157 shown in FIG. 6 is thermally cut by means of a high power laser (not shown), such as an EXIMA laser. Since the Al pattern -cutting region 157 leaves predetermined spaces between the amplifier 106 and the inside photosensor 107, these structural elements are protected against heat generated in case that the Al pattern 112 is laser-cut. Moreover, the following circuit structure can be adopted in stead of lasercutting. An electronic trimming circuit is inserted between the amplifier 106 and the inside photosensor 107, and electrical conduction therebetween is set up only during the inspection of the amplifier.

After the Al pattern 112 is cut, an optical coupling system, which is composed of a ferrule (not shown), an optical fiber 102 shown in FIG. 4 and an optical fiber stopper (not shown), and the outside photosensor 104 are implemented on the package of the light-receiving module 162. In this embodiment, an InGaAs-PIN photodiode (PD, hereinafter) is implemented in conformity with the wavelength of the light signal transmitted through the optical fiber 102. In stead of the PD of this type, a Ge-APD (avalanche photodiode) or a photosensor of a other type can be adopted according to the purpose of the optical transmission. Then, the outside photosensor 104 and the connecting pad 109 on the semiconductor chip 105 shown in FIG. 6 are connected with each other by the bonding wire 111 shown in FIG. 4, and the amplifier 106 has come to be able to amplify the output of the outside photosensor 104. In this embodiment, since the InGaAs-PIN-PD is employed as the photosensor, the efficiency of O/E-conversion becomes high in case that the optical signal in the 1.3μm band is received, and excellent receiving characteristic can be achieved. As mentioned in the above, according to the invention shown in claim 1, the semiconductor amplifier playing essential role and the inside photosensor for inspecting it are mounted on the same semiconductor chip. In case that the semiconductor amplifier unit is discriminated to be normal by inspection, electrical conduction between the output port of the inside photosensor and the input port of the semiconductor amplifier unit is interrupted in order to promote the fabrication process of the light-receiving module. Accordingly, in case that the semiconductor amplifier unit dose not satisfy the specification, the fabrication process is'discontinued at this stage. Then, other parts and wires for connecting them dose not become useless, and the inside photosensor for inspecting the semiconductor amplifier unit can be diverted to some other purpose.

According to the invention shown in claim 5, the outside photsensor, which is formed outside the semiconductor chip comprising a semiconductor amplifier unit, is used as an O/E converter for receiving the light signal, the outside photosensor can be formed in conformity with the characteristics of the semiconductor amplifier unit, and the semiconductor amplifier unit can be formed on the low-priced semiconductor chip. Accordingly, the light-receiving module with high quality can be provided at a low price.

According to the invention shown in claim 2, since a predetermined part of a conductor pattern, which is inserted between the output port of the inside photosensor for inspecting the semiconductor amplifier unit and the input port of the semiconductor amplifier unit, is cut, the step of cutting the conductor pattern can be automated by means of a high power laser, hence efficiency of fabrication of the light-receiving module can be improve.

Moreover, according to the invention shown in claim 3, since the light-receiving module is provided with an electronic trimming circuit, which is inserted between the output port of the inside photosensor for inspecting the semiconductor amplifier unit and the input port of the semiconductor amplifier unit and interrupts electrical conduction therebetween ant need, no special apparatus is necessary for cutting the conductor pattern and it is unnecessary to form the conductor pattern by using an easily meltable material.

According to the invention shown in claim 6, since a step of inspecting the semiconductor amplifier is inserted between the plural steps for fabricating the light-receiving module and succeeding steps are stopped in case that the semiconductor amplifier is discriminated to be rejected, parts to be used in the succeeding steps does not become useless, and manpower required for the succeeding steps and increase of cost of a product can be saved.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is that:

1. A semiconductor chip comprising:
   a semiconductor amplifier unit mounted on a substrate for amplifying an electrical signal supplied from an outside of said substrate,
   a photosensor mounted on said substrate for converting a light incident thereon into an electrical inspection signal for inspecting said semiconductor amplifier unit, and
   electrical inspection signal transmission means inserted between an output port of said photosensor and an input port of said semiconductor amplifier unit, which is interrupted on condition that said semiconductor amplifier unit has been recognized as suitable for specifications in said inspection.

2. A semiconductor chip according to claim 1, wherein:
   said inspection signal transmission means is a signal conducting pattern, a predetermined part of which is cut in case that said inspection signal transmission means is to be interrupted and leaves predetermined spaces between other circuit elements on said semiconductor chip.

3. A semiconductor chip according to claim 1, wherein:
   said electrical inspection signal transmission means comprises an electronic trimming circuit for electronically interrupting said electrical inspection signal.

4. A semiconductor chip according to claim 1, wherein:
   said substrate is a Si-substrate.

5. A light-receiving module comprising:
   a semiconductor chip comprising:
       a semiconductor amplifier unit mounted on a substrate for amplifying an electrical signal supplied from an outside of said substrate,
       a first photosensor mounted on said substrate for converting a first light incident thereon into an electrical inspection signal for inspecting said semiconductor amplifier unit, and
       electrical inspection signal transmission means inserted between an output port of said first photosensor and an input port of said semiconductor amplifier unit, which is interrupted on condition that said semiconductor amplifier unit has been recognized as suitable for specifications in said inspection;
   a second photosensor allocated outside said substrate for converting a second light incident thereon into an electrical information signal, and
   said electrical information signal transmission means inserted between an output port of said second photosensor and said input port of said semiconductor amplifier unit, which is established on condition that said electrical inspection signal transmission means has been interrupted.

6. A method for fabricating a light-receiving module comprising the steps of:
   forming a semiconductor chip comprising:
       a semiconductor amplifier unit mounted on a substrate for amplifying an electrical signal supplied from an outside of said substrate,
       a first photosensor mounted on said substrate for receiving a first light for inspecting said semiconductor amplifier unit, and
       an electrical inspection signal transmission pattern inserted between an output port of said first photosensor and an input port of said semiconductor amplifier unit;
   discriminating whether said semiconductor amplifier unit is suitable for specifications or not by irradiating said first photosensor with said first light,
   cutting said electrical inspection signal transmission pattern on condition that said semiconductor amplifier unit is recognized as suitable for said specifications, and
   connecting said input port of said semiconductor amplifier unit with an output port of a second photosensor allocated outside said substrate for receiving a second light serving as a light signal.

* * * * *

UNITED STATES PATENT AND TRADEMARK OFFICE
CERTIFICATE OF CORRECTION

PATENT NO. : 5,841,565
DATED : November 24, 1998
INVENTOR(S) : Tatsuo KANAI

It is certified that error appears in the above-indentified patent and that said Letters Patent is hereby corrected as shown below:

On the title page, insert Item [30] as follows:

--[30] Foreign Application Priority Data

March 21, 1997 [JP] Japan . . . .9-068316--.

Signed and Sealed this

Third Day of April, 2001

Attest:

NICHOLAS P. GODICI

Attesting Officer

Acting Director of the United States Patent and Trademark Office